United States Patent [19]
Castro

[11] Patent Number: 5,050,123
[45] Date of Patent: Sep. 17, 1991

[54] RADIATION SHIELD FOR EPROM CELLS

[75] Inventor: Hernan A. Castro, Shingle Springs, Calif.

[73] Assignee: Intel Corporation, Santa Clara, Calif.

[21] Appl. No.: 612,452

[22] Filed: Nov. 13, 1990

[51] Int. Cl.⁵ .............................................. G11C 7/02
[52] U.S. Cl. ...................................... 365/53; 365/104; 365/114; 365/185; 365/218; 357/23.5; 357/84
[58] Field of Search ................ 365/53, 104, 114, 218, 365/185; 357/23.5, 84

[56] References Cited

U.S. PATENT DOCUMENTS

| | | | |
|---|---|---|---|
| 3,728,695 | 4/1973 | Frohman-Bentchkowsky ... | 365/185 |
| 3,744,036 | 7/1973 | Frohman-Bentchkowsky ... | 365/185 |
| 4,519,050 | 6/1982 | Folmsbee ............................. | 365/53 |
| 4,530,074 | 7/1985 | Folsmbee ............................. | 365/53 |
| 4,665,503 | 5/1987 | Glasser ................................. | 365/185 |
| 4,758,869 | 7/1988 | Eitan et al. ............................ | 357/84 |
| 4,758,984 | 7/1988 | Yoshida ................................ | 365/104 |
| 4,805,138 | 2/1989 | McElroy et al. .................... | 365/218 |
| 4,970,565 | 11/1990 | Wu et al. ............................. | 357/84 |

Primary Examiner—Joseph E. Clawson, Jr.
Attorney, Agent, or Firm—Blakely, Sokoloff, Taylor & Zafman

[57] ABSTRACT

An improved shield for an EPROM cell comprising a first and second metalization cover sections along with upstanding elements is disclosed. The invented shield protects selected EPROM cells from exposure to radiation in redundant memory applications. The shielding structure is designed such that radiation incident upon the memory only reaches the cell after traveling a circuitous route defined by the upstanding members. The improvement also increases the reliability of the memory while adding a degree of flexibility to the layout of the cell.

7 Claims, 4 Drawing Sheets

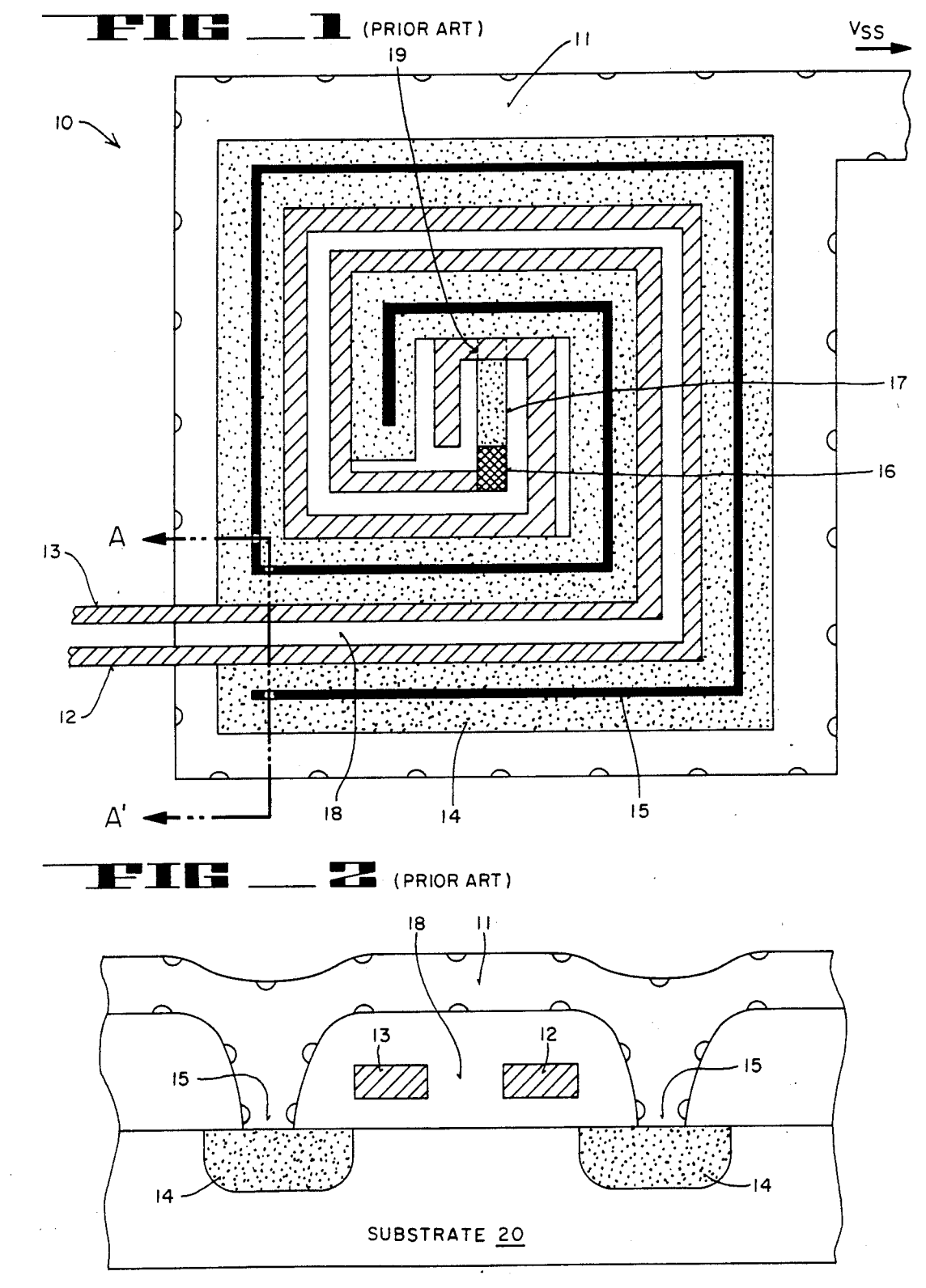

FIG_1 (PRIOR ART)

FIG_2 (PRIOR ART)

SUBSTRATE 20

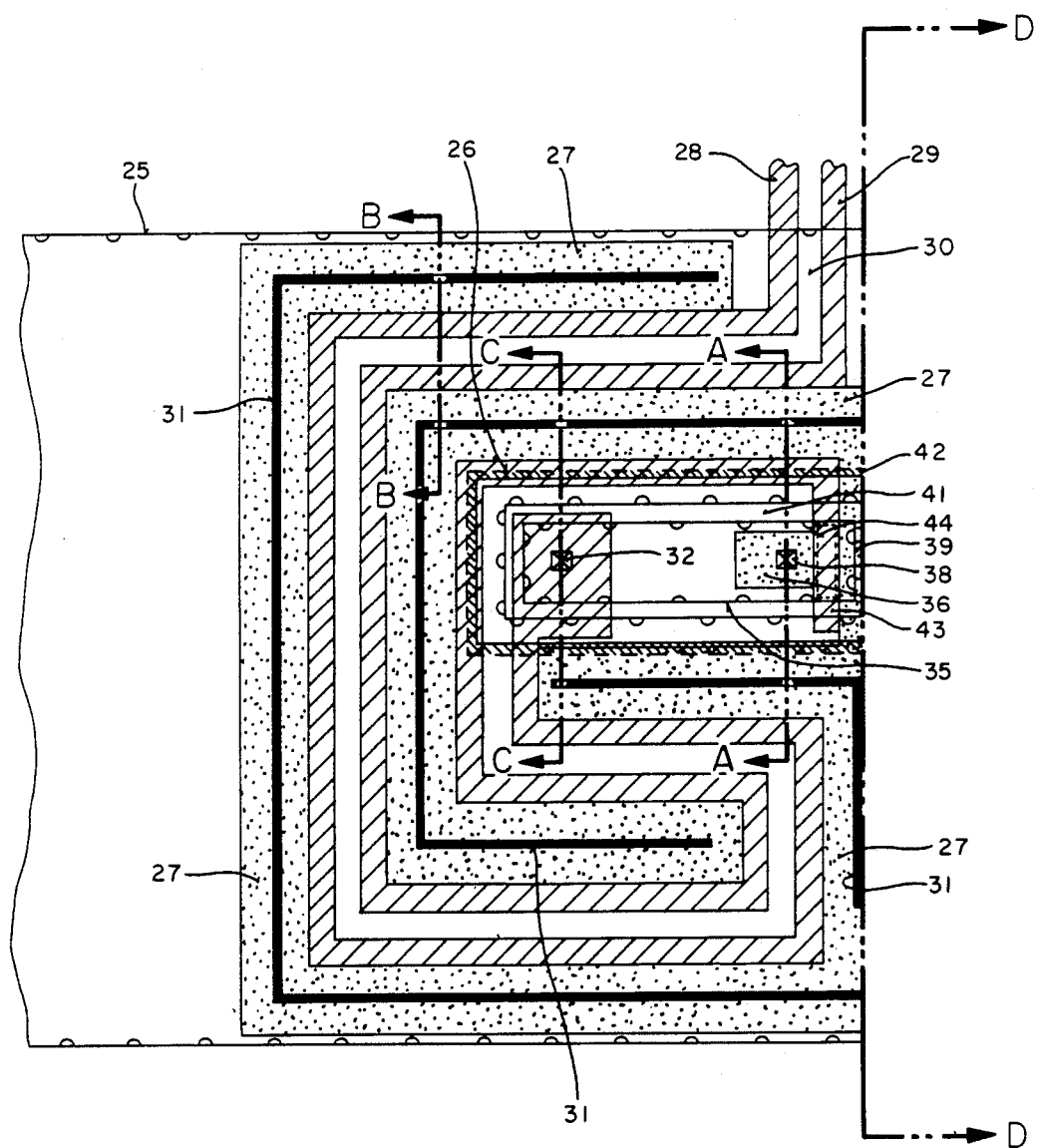
FIG_3

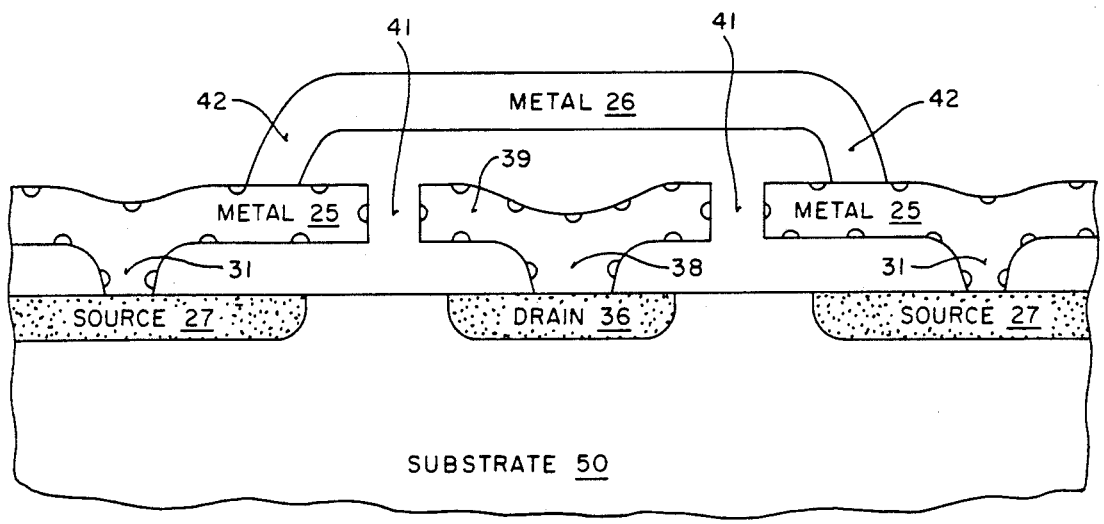
FIG_4
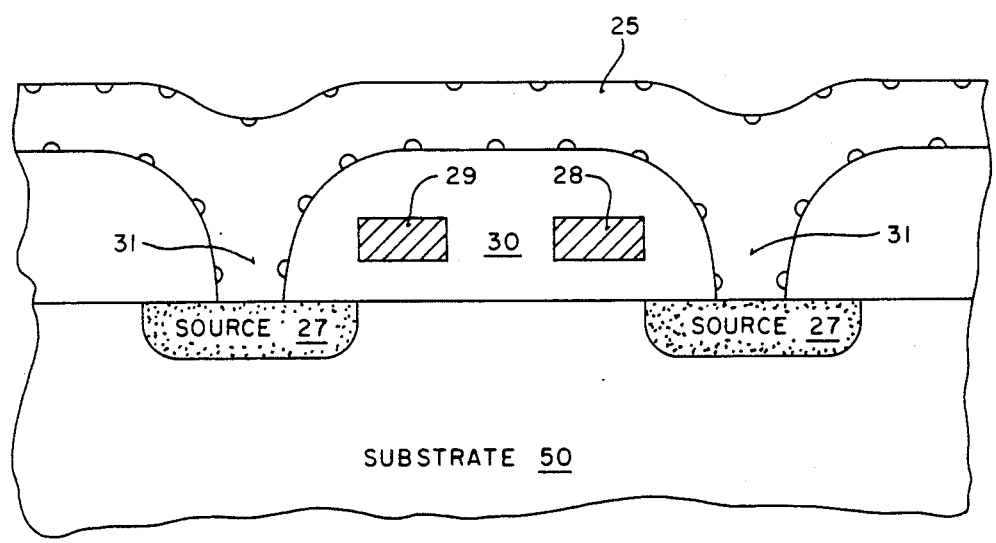
FIG_5

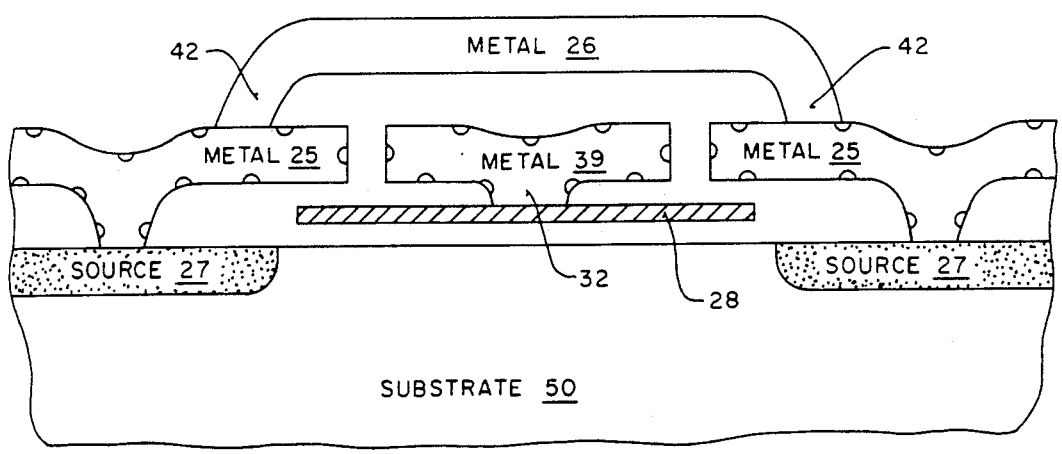
FIG_6

RADIATION SHIELD FOR EPROM CELLS

FIELD OF THE INVENTION

This invention relates to the field of electrically programmable read-only memories (EPROMs); particularly, to EPROMs which can be erased upon exposure to radiation.

BACKGROUND OF THE INVENTION

Electrically programmable read-only memories (EPROMs) are well understood in the prior at. These memories typically comprise an array of individual EPROM cells which store information in the form of an electrical charge. An example of a cell for such memories is described in U.S. Pat. No. 3,996,657. In many cases, these EPROM memories can be erased by exposure to ultraviolet radiation. Memory arrays which employ cells that are erasable upon exposure to ultraviolet radiation are disclosed in U.S. Pat. Nos. 3,728,695 and 3,744,036.

It is widely recognized that employing redundant rows and columns is beneficial for replacing defective rows and columns of cells in prior art EPROM arrays. Most often, fusible silicon links are used to enable these redundant elements. When used in memory arrays which can be erased by ultraviolet radiation, the integrated circuit must include some means for protecting these redundant areas from radiation. In the past, this has been accomplished by shielding the redundant EPROM cells with a metal covering layer. An example of a radiation shield for an integrated circuit memory with redundant elements is disclosed in U.S. Pat. No. 4,519,050 (hereinafter the '050 patent), which is also assigned to the assignee of the present invention.

The radiation shield described in the '050 patent suffers from several drawbacks. To begin with, the '050 patent teaches the use of buried contacts in a single metal-oxide-semiconductor (MOS) fabrication process. These contacts are utilized for providing electrical contact between the n+drain diffusion regions and a polysilicon conductor. The polysilicon conductor spiral out of the EPROM cell underneath the overlying metal protective shield, and provide connection to extend circuits in the memory.

The fabrication sequence required to produce these buried contacts is complex and requires numerous processing steps. A further drawback of buried contacts is that they exhibit a high resistivity and are generally unreliable over the lifetime of the part. However, eliminating buried contacts still leaves the problem of making electrical connection between the drain region and the other devices within the EPROM memory. In a single metal layer process, it has proven difficult to provide a metallic radiation shield while at the same time providing metalized contacts to the underlying diffusion regions in the substrate.

One alternative to the use of buried contacts is to form an n-well region under the radiation shield to provide direct connection to the n+drain diffusion region via the substrate. However, this approach suffers from the fact that the n-well conductor is highly resistive, rendering this approach impractical. Therefore, what is needed is an improved radiation shield for electrically programmable read-only storage devices which obviates the need for buried contacs and which provides additional flexibility in the patterning of the interconnect lines.

SUMMARY OF THE INVENTION

The present invention covers an improved radiation shield structure for electrically programmable read-only memory cells. These cells are typically organized into an array wherein each of the cells is erasable upon exposure to radiation. It is often desirable to shield at least one of the EPROM cells from radiation for memory applications which employ redundant rows and columns of cells to replace defective devices.

The invention relies on a first shielding member which has first and second cover sections separated by a narrow slot. This shielding member preferably comprises a first layer of metal. Upstanding members are formed which extend from the first cover section to the substrate disposed around the EPROM cell. These upstanding members define a circuitous route through which radiation must traverse before reaching the active regions of the EPROM cell. It is important to note that except for the presence of the slot, the first and second cover sections substantially cover the entire EPROM cell.

A second shielding member is also included to cover the slot such that radiation incident upon the memory array only reaches an EPROM cell after travelling the circuitous route defined by the upstanding members. This route is usually designed to include numerous bends or angles to reflect and attenuate the radiation to the point where it is completely incapable of erasing the cell.

In the preferred embodiment, the upstanding members comprise metal which makes electrical contact with the underlying source region in the substrate. The drain region and control gate of the EPROM cell are coupled to polysilicon conductors which travel through the circuitous route before passing through an opening in the upstanding members. This opening allows them to make contact with other devices in the memory. Note that this opening is the only means by which light or other radiation may impinge upon the active regions of the EPROM cell.

The second shielding member preferably comprises a second metalization layer such as aluminum and also includes a continuous via section which extends from the covering second metal layer down to the first cover section of the first metalization layer. This occurs along the perimeter of the second metal covering layer, thereby sealing the slot from direct exposure to radiation.

BRIEF DESCRIPTION OF THE DRAWINGS

The novel features belived characteristic of the invention are set forth in the appended claims. The invention itself however, as well as other features and advantages thereof, will be best understood by reference to the description which follows, read in conjunction with the accompanying drawings, wherein:

FIG. 1 is a topological layout of a prior art EPROM cell which utilized buried contacts and a single metal layer fabrication process.

FIG. 2 is a cross-sectional elevation view of the EPROM cell of FIG. 1.

FIG. 3 is a topological layout of the presently preferred embodiment of the invention.

FIG. 4 is a cross-sectional elevation view of the EPROM cell of FIG. 3 taken through lines A—A.

FIG. 5 is a cross-sectional elevation view of the EPROM cell of FIG. 3 taken through lines B—B.

FIG. 6 is another cross-sectional elevation view of the EPROM cell of FIG. 3 taken through lines C—C.

DESCRIPTION OF THE PREFERRED EMBODIMENT(S)

A radiation shield structure is described for an ultraviolet (UV) sensitive EPROM cell. The invention protects the electrically programmable read-only memory cell so as to prevent erasure of the cell upon exposure to radiation. The shield of the present invention may be fabricated on the same substrate as the electrically read-only memory cells which can be erased when exposed to radiation. Thus, the invention permits selective EPROM cells within the memory array to be effectively converted to programmable read-only memory (PROM) cells by shielding these selected cells from radiation. When shielding, these selected cells may be used to store the addresses of redundant elements for replacing defective rows and columns within the EPROM memory array.

FIG. 1 is representative of a prior art EPROM cell which includes a radiation shield to prevent erasure upon exposure to radiation. The EPROM cell comprises spaced-apart source and drain diffusion regions 14 and 17, respectively. A polysilicon floating gate member 19 is disposed above the substrate over the channel region. Floating gate 19 stores the electrical charge indicative of the informational contact of EPROM cell 10. Insulated and disposed above floating gate 19 is polysilicon control gate 12. N+drain region 17 is coupled to polysilicon conductor 13 through buried contact 16.

Notice that polysilicon conductors 12 and 13 follow a bending path as they exit from EPROM cell 10. This path is designed to effectively minimize the intensity of incident radiation reaching the drain and gate regions of EPROM cell 10. The radiation shield for cell 10 is made up of a single metal layer 11 which completely covers cell 10. Shielding metal layer extends down to the substrate at contact region 15 as shown in FIG. 1. Contact regions 15 define the bending path that conductors 12 and 13 must follow in order to reach the control gate and drain regions of EPROM cell 10. Incident radiation enters through opening 18 in the radiation shield and is attenuated as it travels through the winding pathway defined by contact regions 15.

As previously mentioned, the cell of FIG. 1 has certain drawbacks which stem from the use of buried contact 16 and a single metal conductor layer 11. Forming buried contacts involves very difficult and complex processing, and they do not always provide reliable electrical connection. Moreover, as was previously discussed, a single metal interconnect system limits the flexibility of the layout of the EPROM memory.

FIG. 2 illustrates a cross-sectional elevation view of the prior art cell of FIG. 1 taken along lines A—A. As can be seen, polysilicon conductors 12 and 13 are shown disposed above and insulated from substrate 20. These conductors are also insulated from metal layer 11. Normally, polysilicon conductos 12 and 13 are completely surrounded by an insulating layer of silicon dioxide. Opening 18 is formed by the space between conductors 12 and 13 and by the surrounding cavity defined by metal layer 11 and contact regions 15.

The problems associated with the prior art are overcome by the shielded EPROM cell of FIG. 3. FIG. 3 is a topological view of the presently preferred embodiment of the invention. In constrast to the cell of FIGS. 1 and 2, the EPROM cell of FIG. 3 includes a radiation shield comprising first and second metalization layers. The first metalization layer is divided into two sections: section 25 which covers most of the conductors leading into the EPROM cell, and section 39 which covers the active area of the cell and provides electrical connection to the drain diffusion region within the substrate. Metal regions 39 and 25 are separated by a slot 41. Preferably, slot 41 is made equal to the minimum metal-to-metal spacing for the first metalization layer (e.g., metal 1). It is appreciated that although section 39 is shown to be rectangular in shape, practically it may assume a great variety of shapes (e.g., circular, square, etc).

First metal layer section 39 contacts the underlying drain diffusion region 36 through metal-to-substrate contact 38. Contact 38 extends downward from section 39 to the substrate. First metal layer section 39 is connected at the other end to polysilicon conductor 28 through metal-to-polysilicon contact 32.

Control gate 43 overlies the channel separating drain region 36 from source region 27. Sandwiched between control gate 43 and the channel is floating gate 44. Floating gate 44 is completely surrounded by an insulative layer which separates it from the underlying substrate and overlying control gate 43. Both the floating gate 44 and control gate 43 normally comprise polysilicon. Control gate 43 is connected to polysilicon conductor 29 which—along with polysilicon conductor 28—enter the EPROM cell through opening 30. From there, both conductor 28 and 29 travel a circuitous route before reaching the drain and control regions of the EPROM cell. This circuitous route is defined by source region 27 and upstanding members 31.

As can be seen, the first metalization layer section 25 covers virtually all of the EPROM cell except for those areas occupied by slot 41 and first metal layer section 39. First metal layer section 25 also extends downward to contact source region 27 via upstanding members 31. Members 31 simply comprise metal-to-substrate contacts extending from the first metalization layer down to the substrate. In this way, metal layer section 25, together with upstanding members 31 define a sort of tunnel or circuitous path leading to the active of the EPROM cell. The entrance to this tunnel is shown by opening 30. Opening 30 allows access to the cell through conductors 28 and 29.

At the other end of the defined tunnel light is prevented from entering through slot 41 by means of second metalization layer 26. Layer 26 effectively seals off slot 41 and first metalization layer section 39 from any radiation that may impinge upon the EPROM memory. Note that second metalization layer 26 is shown in FIG. 3 by dashes lines. Along the perimeter of layer 26 lies a metal-to-metal via contact 42. Via contact 42 extends downward from second metal layer 26 to first metal layer section 25. Thus, second metal layer 26 and via 42 seals off the active regions of the EPROM cell from any radiation which might penetrate through slot 41.

It is appreciated that the EPROM cell and radiation shield of FIG. 3 are integrally formed as part of a single device which is normally fabricated as part of a two cell device structure. The second cell is represented (not shown in FIG. 3) by a mirrored image of the cell shown in FIG. 3 taken along lines D—D. In other words, two cells typically share a common source region 27 while shielding members 26 and 25 normally extend to protect both cells from incident radiation.

The protective properties of the shield of the present invention can be best understood by viewing FIG. 3 in conjunction with FIGS. 4–6. Radiation travels in a straight line and, except as it is reflected, it will not traverse sharp bends, corners or angles. Therefore, the presence of the radiation shield means that ultraviolet light can only enter in through opening 30. To reach the active portions of the EPROM cell, this radiation must be reflected around seven 90° corners. The number of reflections and the distance transversed by the radiation are selected so as to insure that the energy of the radiation is adequately attenuated such that charge residing on floating gate 44 is not removed.

Obviously, other circuitous paths are also possible—some having fewere right angle bends, some having more. In some circumstances, the circuitous path may assume a non-orthogonal route, or even a circular or curvilinear route. In basic terms, all that is required is that the path provide enough reflections over a sufficiently long distance so as to attenuate the energy of the incident radiation to a level where it is no longer capable of erasing the EPROM cell. In this respect, an ordinary practitioner in the art will discover numerous possible alternative embodiments.

With reference to FIG. 4, a cross-sectional view of the shielded EPROM cell of FIG. 3 is shown along cut lines A—A. As can be clearly seen, within substrate 50 are formed source regions 27 and drain region 36. First metalization layer section 39 is shown including metal-to-substrate contact 38, which provides electrical connection down to drain region 36. Metal section 39 is separated from first metalization layer section 25 on either side by slot 41. Similarly, metal sections 25 are shown coupled to source regions 27 through contacts 31.

Normally the surface of substrate 50 is covered with an insulated layer (e.g., silicon dioxide) prior to deposition of the first metalization layer. This means that contact opening must be etched through this insulative layer to expose electrical connection areas in the underlying substrate. For instance, in certain processes a barrier metal layer such as titanium or tungsten is first deposited in these contact openings to provide a reliable electrical contact to the underlying silicon layer.

Next, a metal is deposited uniformly over the surface of the substrate. This metal layer is then patterned to form the first metalization interconnects. Typically, aluminum or aluminum alloy is employed. By way of example, slot 41 is formed utilizing standard photolithographic techniques during the patterning of the first metalization layer which comprises sections 25 and 39. Contact openings in the dielectric layer separating the first metalization layer from the substrate produce contacts 31 and 38. Note that contacts 31 comprise the uprising members which help to confine and reflect the incident radiation as it travels from opening 30 to the active region of the EPROM cell.

After the first metalization layer has been formed, a dielectric layer is deposited, via openings are defined and a second metalization layer is deposited. The second metalization layer is then patterned to produce metal layer 26 and via 42 as shown in FIG. 4. Via 42 extends downward from second metalization layer 26 to first metalization layer section 25. Notice that metal layer 26 completely covers first metalization layer section 39 and slot 41. Via 42 also extends completely around the periphery of metal layer 26. In this manner, the combination of via 42 and metal layer 26 acts to completely seal off the active region of the EPROM cell so that radiation cannot penetrate through slot 41.

FIG. 5 illustrates a cross-sectional elevation view of the shielded EPROM cell of FIG. 3 taken from cut view B—B. Basically, the view of FIG. 5 illustrates how radiation may enter the EPROM cell through opening 30 between polysilicon conductors 29 and 28. Opening 30 is filled with an insulative material, preferably silicon dioxide. However, other insulators may also be used. For instance, it may be desirable in certain embodiments to choose an insulator which absorbs radiation of a particular wavelength used during erasing (e.g., ultraviolet light).

Futhermore, the amount of radiation which penetrates through opening 30 can be minimized by minimizing the total width of the opening, within design rule constraints, of course. Note also that by connecting source regions 27 to the first metalization layer section 25, the source regions can easily be connected to other circuitry or grounded without the need for bringing another conductor out through opening 30.

FIG. 6 illustrates a cross-sectional view of the shielded EPROM cell of FIG. 3 taken along lines C—C. In this view it is evident that first metalization layer section layer 39 is connected to polysilicon conductor 28 through contact region 32. Practitioners in the art will appreciate that it is much easier to make a metal-to-polysilicon contact instead of a polysilicon-to-substrate buried contact, as was common in the prior art. Utilizing a metal-to-poly and metal-to-substrate combination in the present invention also results in a more reliable contact structure. Moreover, having two metalization layers available also provides an added degree of flexibility in the layout of the memory circuit.

Many variations on the preferred embodiment can be realized depending on the intensity of radiation which the EPROM cell can withstand before being erased. For example, additional right angle bends could be added to the circuitous route of the shielding structure so that radiation would have to undergo additional attenuating reflections before reaching the EPROM cell. It may also be possible in certain cases to utilize conductors other than metal which are sufficiently opaque to radiation to act as a shielding member. Thus, it would be obvious to one having ordinary skill in the art the numerous other modifications and departures may be made in the layout of the shielding structure depending on the degree of protection required, the number of cells to be shielded, and other similar factors.

Thus, an improved radiation shield for EPROM cells has been described.

I claim:

1. In an electrically programmable read-only memory (EPROM) fabricated on a semiconductor substrate and organized into an array of individual cells, wherein each of said cells is normally erased upon exposure to radiation, an improvement for shielding at least one EPROM cell from radiation comprising:

a first shielding member having first and second cover sections separated by a slot and upstanding members extending from said first cover section to said substrate disposed about said EPROM cell, said first and second sections substantially covering said cell except for said slot;

a second shielding member covering said slot such that radiation incident upon said memory only reaches said cell after traveling a circuitous route defined by said upstanding members, said route attenuating the radiation so that it is incapable of erasing said cell.

2. The improvement of claim 1 wherein said first and second shielding members are comprised of first and second metal layers, respectively.

3. The improvement of claim 2 wherein said EPROM cell comprises a control gate disposed over said substrate and spaced-apart source and drain regions formed in said substrate, with said upstanding members being electrically connected to said source region, said control gate being connected to a first conductor and said drain region being coupled to a second conductor through said second section.

4. The improvement of claim 3 wherein said first and second conductors pass through an opening in said upstanding members and traverse said circuitous route before reaching said control gate and drain region, respectively.

5. The improvement of claim 4 wherein said second shielding member further comprises a continuous via section extending from said second metal layer to said first cover section of said first shielding member along the perimeter of said second metal layer, thereby sealing said slot from direct exposure to radiation.

6. The improvement of claim 5 wherein said circuitous route includes at least one angle of approximately 90°.

7. The improvement of claim 6 wherein said first and second conductors comprise polysilicon.

* * * * *

UNITED STATES PATENT AND TRADEMARK OFFICE
CERTIFICATE OF CORRECTION

PATENT NO. : 5,050,123
DATED : 9/17/91
INVENTOR(S) : Hernan A. Castro

It is certified that error appears in the above-indentified patent and that said Letters Patent is hereby corrected as shown below:

Column 1, line 13, delete "at" insert --art --.

Column 3, line 19, delete "shielding " insert --shielded --.

Signed and Sealed this

Eighteenth Day of January, 1994

Attest:

BRUCE LEHMAN

Attesting Officer

Commissioner of Patents and Trademarks